United States Patent [19]

Eskelinen

[11] Patent Number: 4,999,584
[45] Date of Patent: Mar. 12, 1991

[54] SIGNAL-SHAPING NETWORK

[75] Inventor: Paavo Eskelinen, Oulu, Finland

[73] Assignee: Noraxon Oy, Oulu, Finland

[21] Appl. No.: 364,425

[22] PCT Filed: Nov. 26, 1987

[86] PCT No.: PCT/FI87/00158
   § 371 Date: Jul. 20, 1989
   § 102(e) Date: Jul. 20, 1989

[87] PCT Pub. No.: WO88/04114
   PCT Pub. Date: Jun. 2, 1988

[30] Foreign Application Priority Data

Nov. 28, 1986 [FI] Finland ................................ 864857

[51] Int. Cl.⁵ ............................................ H03F 1/34
[52] U.S. Cl. .................................... 330/107; 330/260; 330/294
[58] Field of Search ............. 330/107, 294, 258, 260; 128/902

[56] References Cited

U.S. PATENT DOCUMENTS

| 3,972,006 | 7/1976 | Ruegg | 330/107 |
| 4,243,918 | 9/1981 | Meise | 315/389 |
| 4,494,551 | 1/1985 | Little, III et al. | 330/294 X |
| 4,543,536 | 9/1985 | Pederson | 330/107 X |

Primary Examiner—James B. Mullins
Attorney, Agent, or Firm—William B. Kempler

[57] ABSTRACT

The invention relates to a signal-shaping network comprising a differential amplifier (G) having an output and an inverting (A) and a non-inverting (B) input between which a signal source (S) is connected. When a differential amplifier is used particularly for the measuring of very weak biosignals, interference signals may easily make the measuring completely impossible. In the signal-shaping network according to the invention, interferences have been eliminated in such a way that an integrating feedback circuit (1a; 1b) is connected between the output and one input of the differential amplifier (G) and/or a derivative feedback circuit (2a) is connected between the output and the other input of the differential amplifier. In this way an adaptive differential amplifier is achieved which attenuates slow interference signals and/or rapid interference signals.

14 Claims, 3 Drawing Sheets

SIGNAL-SHAPING NETWORK

The present invention relates to a signal-shaping network comprising a differential amplifier having an output and an inverting and a non-inverting input between which a signal source is connected.

Figure 1:
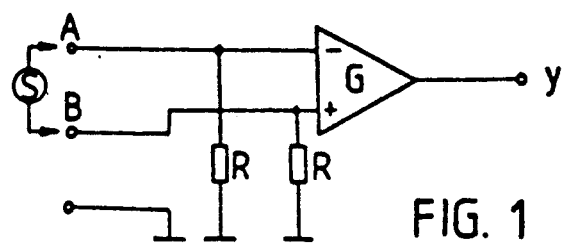

FIG. 1 illustrates the principle of a typical differential amplifier of the above kind, applied e.g. in the measuring of bioelectric phenomena. The signal between input terminals A and B is obtained amplified from the output of an amplifier G, i.e. an output signal $y = Gs + c$, wherein G = an amplifying coefficient and c represents an error term caused by interferences. The value of this factor depends on the magnitude of a common mode interference signal acting at the input terminals of the differential amplifier, the CMRR (common mode rejection ratio) factor of the amplifier, the impedance of the signal source (e.g. the moistness of skin), and the ratio between the resistances between the input terminals and the earth, i.e. how close their values are to each other.

In practice, the interference signals acting at the input terminals of the amplifier are unequal in most cases, whereby not only the desired signal but also the difference signal of this interference will be amplified G-fold at the output of the amplifier. This usually results in a forceful interference in the output signal y, G being typically 100...1000.

Biosignal amplifiers are usually intended for ac signals, so that in principle it would be possible to attenuate slower (interference) potential changes by connecting series capacitors to both input terminals. This, however, would deteriorate the matching between the impedances of the input terminals and, on the other hand, a strong interference might easily overdrive the amplifier into an inoperative state for a longer period of time due to the charging of the capacitors. For this reason differential amplifiers are nearly without exception dc-connected, whereby they, however, are very sensitive to disturbances the energy of which is concentrated at the lower end of the frequency spectrum (e.g. movements and bumps). The easiest way of attenuating rapid, periodical disturbances is to connect low pass filters having the marginal frequency clearly above the net interference frequency (50 Hz) e.g. directly to the input terminals.

Figure 2:
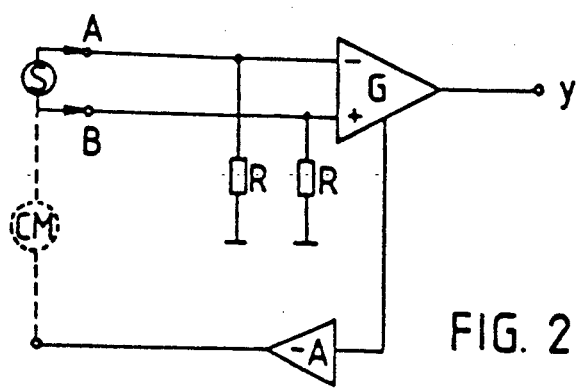

The attenuation of common mode interferences can be improved to some extent (approx. 10...20 dB) in a known manner shown in FIG. 2 by connecting an interference applied from the input terminals of the differential amplifier (a common mode interference) amplified and with a phase shift of $-180°$ back as active earth to which an earth connection electrode is connected.

However, prior signal-shaping networks based on a differential amplifier, described in FIGS. 1 and 2, are practically unsuitable for measurings to be carried out in conditions liable to disturbances, such as for the real-time measurement of the profile of a muscle tonus (EMG signal) occurring during free movement performance. Thus the object of the present invention is to provide a signal-shaping network suited for purposes mentioned above, giving extremely reliable and clear information on the magnitude to be measured without that the interpretation of the measuring results would be affected by interference signals.

The above object is achieved by means of a signal-shaping network according to the invention, which is characterized in that an integrating feedback circuit is connected between the output and one input of the differential amplifier and/or a derivative feedback circuit is connected between the output and the other input of the differential amplifier. The integrating feedback circuit is preferably connected to the non-inverting input of the differential amplifier with a phase shift of $-180°$ or to the inverting input thereof with a phase shift of $0°$. Correspondingly, the derivative feedback circuit is preferably connected to the non-inverting input of the differential amplifier with a phase shift of $-180°$ or to the inverting input thereof with a phase shift of $0°$.

By means of the feedbacks of the above kind, an adaptive differential amplifier is achieved which effects an adaptive attenuation of an interference signal at low and/or high frequencies, thus enabling a stable and substantially interference-free measuring of even very weak biosignals.

Figure 3A:
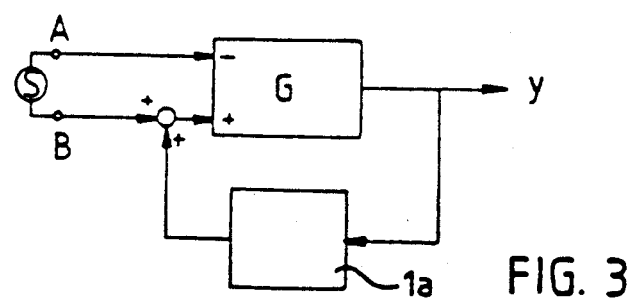
Figure 3B:
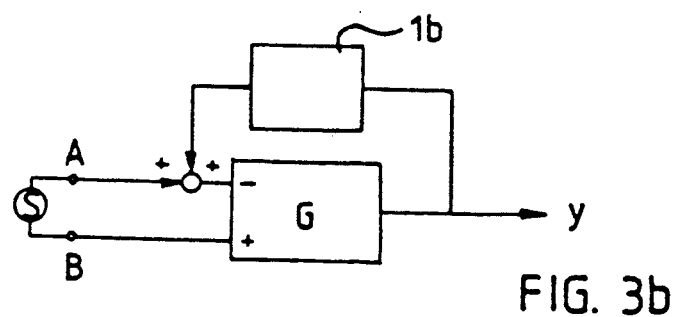
Figure 4:
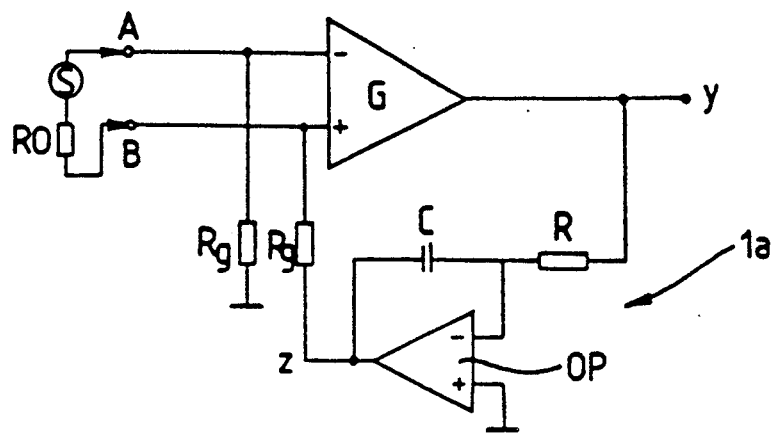
Figure 5:
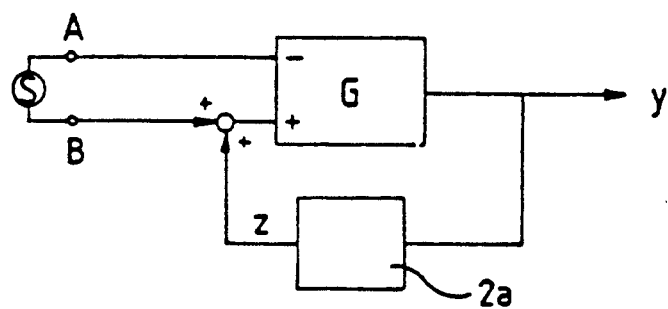
Figure 6:
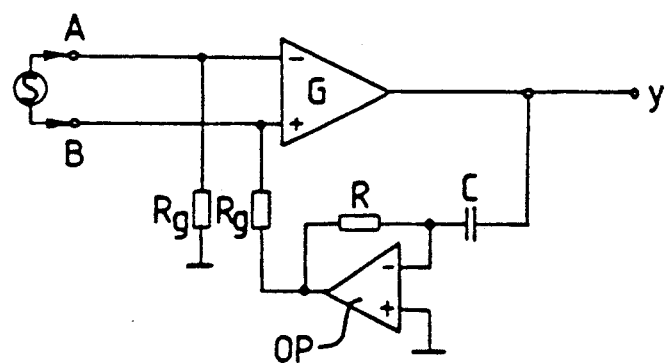

In the following the signal-shaping network according to the invention will be described in more detail with reference to the attached drawing, wherein FIG. 1 illustrates the connecting principle of a conventional differential amplifier of the prior art, FIG. 2 illustrates the connecting principle of another conventional differential amplifier of the prior art, FIG. 3a illustrates the connecting principle of a first differential amplifier according to the invention, FIG. 3b illustrates the connecting principle of a second differential amplifier according to the invention, FIG. 4 illustrates in more detail the realization of the connecting principle of FIG. 3a, FIG. 5 illustrates the connecting principle of a third differential amplifier according to the invention, and FIG. 6 illustrates in more detail the realization of the connecting principle of the third embodiment of the invention shown in FIG. 5.

Figure 7:
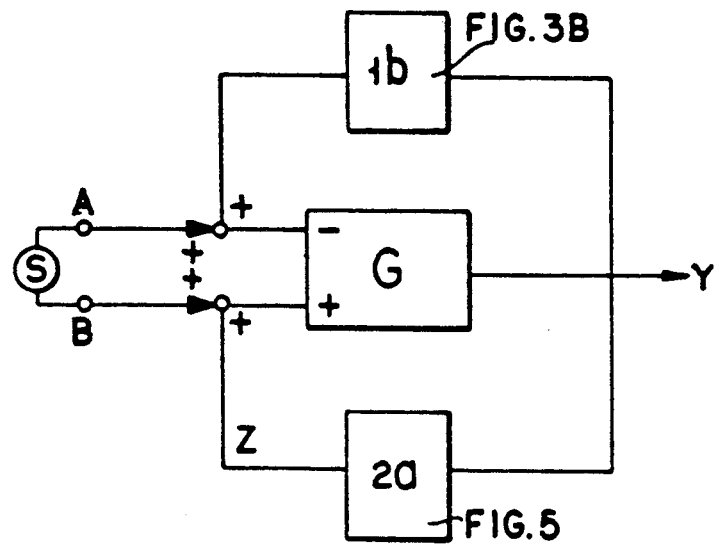
Figure 8:
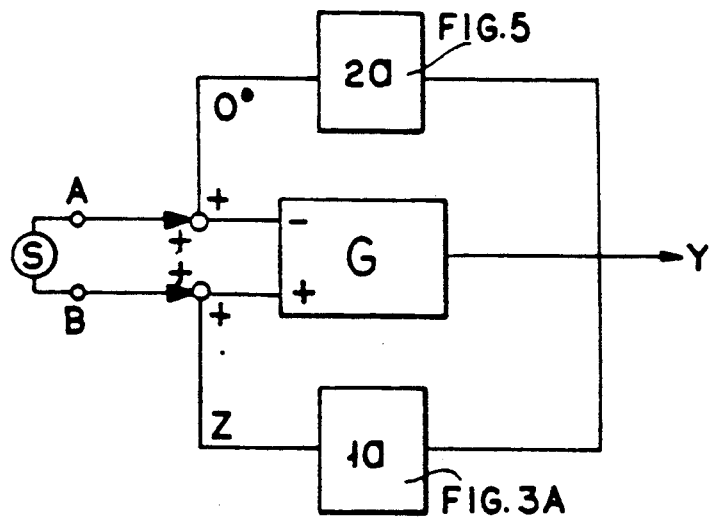

FIG. 7 illustrates the connecting principle of a differential amplifier having both integrating and derivative feedback, FIG. 8 illustrates an alternative embodiment of the connecting principle of a differential amplifier having both integrating and derivative feedback.

FIGS. 3a and 3b show a block diagram of an adaptive differential amplifier according to the invention particularly suited for a stable and substantially interference-free measuring of very weak ($1...100/\mu V$) biosignals. In the amplifier of FIGS. 3a and 3b, an integral signal z is counted from an output signal y, whereby the integral signal obtained is directly proportional to the amplitude and duration of an input signal S. In the embodiment of FIG. 3a, the integral signal z is applied back to the input terminal B with a phase shift of $-180°$ ($-1/\tau \int y dt$). In the embodiment of FIG. 3b, the integral signal ($1/\tau \int y dt$) is applied back to the input terminal A with a phase shift of $0°$.

FIG. 4 shows a more detailed circuit diagram of the realization of the block diagram of FIG. 3a. Herein an integrating feedback 1a is effected by means of a conventional inverting integrator connection formed by an operational amplifier OP and a resistance R and a capacitor C. In this connection, the resistance R is connected to the output of the differential amplifier G for receiving an output signal y thereof, and one terminal of the resistance R is connected to the negative terminal of the operational amplifier OP, the positive terminal thereof being earthed. The capacitor C is arranged as a feedback component between the negative input terminal and the output terminal of the operational amplifier OP. An output signal z of the operational amplifier is applied through a resistance $R_g$ to a non-inverting input B of the differential amplifier G. A resistance $R_g$ equal in magnitude is connected between one input A of the differential amplifier and an earth connection. By giving the integration time constant ($\tau = RC$) a suitable value, it is possible to determine the range of the rate of change of signals (interferences) such that signals slower than these start to attenuate rapidly. In other words, the slower the interference, the more efficient the attenuation. On the other hand, an increase in the impedance of the signal source automatically shifts the border of the attenuation range towards higher rates of signal change and vice versa, i.e. the amplifier adapts itself to such changes. This kind of adaptive differential amplifier also retains the good CMRR properties thereof, for the input terminal impedances remain resistive and nearly equal in magnitude. This is based on the fact that the output impedance of the operational amplifier OP is very small, so that the effect of the feedback loop on the input terminal impedance is practically insignificant.

In cases where the internal impedance of the input signal source S is very low, it is possible to connect a resistance RO in series with the signal source S between the input terminals A and B, said resistance being chosen so that it is considerably lower than the resistance $R_g$ of the input terminals but clearly higher than the internal impedance of the signal source S.

One important field of application of an adaptive differential amplifier of the above type is a real-time measuring of the profile of a muscle tonus (EMG signal) during free movement performance. The registration of these phenomena is necessary e.g. in the training of different sports as well as in physical and rehabilitative treatments. Previously the measurement of such kinesiological phenomena has not been possible in any greater degree.

FIG. 5 shows a block diagram of the third embodiment of the adaptive differential amplifier according to the invention, in which the attenuation properties increase with an increase in the rates of signal change, so that the operation thereof is a mirror image of the embodiment shown in FIG. 3a. In this embodiment, a derivative of the output signal y of the differential amplifier G is formed instead of the integral thereof, which derivative is summed to the non-inverting input B of the differential amplifier G with a phase shift of $-180°$ ($-\tau \cdot dy/dt$). According to the principle shown in FIG. 3b, this derivative feedback 2a could also be connected between the output of the differential amplifier and the inverting input A thereof, whereby it should have a phase shift of 0°.

The structure of the embodiment of the invention shown in FIG. 5 is illustrated in more detail in FIG. 6, wherein the derivative feedback circuit 2a is effected by means of the operational amplifier OP and the resistance R and the capacitor C. One terminal of the capacitor C is connected to the output of the differential amplifier G, the other terminal thereof being connected both to the resistance R and the inverting input of the operational amplifier OP. The non-inverting input of the operational amplifier OP is connected to the earth. The resistance R is connected across the operational amplifier OP to form a feedback resistance, whereby one terminal thereof is connected to the output of the operational amplifier. This output is through the resistance $R_g$ connected to the non-inverting input terminal B of the differential amplifier G.

FIG. 7 shows a block diagram of another embodiment of the adaptive differential amplifier according to the invention, in which both integrating feedback and differential feedback are utilized. The structure of the embodiment of the invention shown in FIG. 7 is illustrated in more detail in FIG. 8. The structure shown in FIG. 7 represents the combination of the structures shown in FIGS. 3b and 5 and the structure shown in FIG. 8 is a combination of FIGS. 3a and 5 modified in accordance with the principles shown in FIG. 3b. The combined structures combine the results of both of the structures from which they were combined and their operation is the superposition of the operation of the structures from which they are formed.

By means of the adaptive differential amplifier according to the invention it is possible to effect the attenuation of either slow interferences (the embodiments of FIGS. 3a and 3b) or rapid interferences (the embodiment of FIG. 5), or the attenuation of both slow and rapid changes by combining the embodiments of FIGS. 3 and 5, whereby the differential amplifier comprises both a derivative and an integrating feedback.

The invention has been described in detail merely by means of some specific embodiments and it is to be understood that the structure of the feedback circuit essential to the invention, either derivative or integrating, may differ considerably from the above-described simplest realization thereof. The feedback circuit of the differential amplifier according to the invention may consist of nearly any known connection effecting the derivation or integration.

I claim:

1. A signal-shaping network comprising:
    a differential amplifier having an output, an inverting and a non-inverting input;
    means for providing a signal source coupled to said inverting and non-inverting inputs, said signal source not being referenced to a reference potential of said differential amplifier, a voltage differential of said signal source being applied across said inverting and non-inverting inputs; and
    an integrating feedback circuit connected between said output and one of said inputs to said differential amplifier.

2. The signal-shaping network according to claim 1 wherein said integrating feedback circuit is connected to said non-inverting input of said differential amplifier with a phase shift of $-180°$.

3. The signal-shaping network according to claim 2 wherein a first resistance is connected between said feedback circuit and said one input of the differential amplifier and a second resistance of equal magnitude is connected between the other input thereof and a reference potential.

4. The signal-shaping network according to claim 1 wherein said integrating feedback circuit is connected to said inverting input of the differential amplifier with a phase shift of 0°.

5. The signal-shaping network according to claim 1 wherein a first resistance is connected between said feedback circuit and said one input of the differential amplifier and a second resistance of equal magnitude is connected between the other input thereof and a reference potential.

6. A signal-shaping network comprising:
    a differential amplifier having an output, an inverting and a non-inverting input;

means for providing a signal source coupled to said inverting and non-inverting inputs, said signal source not being referenced to a reference potential of said differential amplifier, a voltage differential of said signal source being applied across said inverting and non-inverting inputs; and a derivative feedback circuit connected between said output and one of said inputs of said differential amplifier.

7. The signal-shaping network according to claim 6, wherein said derivative feedback circuit is connected to said non-inverting input of said differential amplifier with a phase shift of −180°.

8. THe signal-shaping network according to claim 7 wherein a first resistance is connected between said feedback circuit and said one input of the differential amplifier and a second resistance of equal magnitude is connected between the other input thereof and a reference potential.

9. The signal-shaping network according to claim 6 wherein said derivative feedback circuit is connected to said inverting input of said differential amplifier with a phase shift of 0°.

10. The signal-shaping network according to claim 6 wherein a first resistance is connected between said feedback circuit and said one input of the differential amplifier and a second resistance of equal magnitude is connected between the other resistance of equal magnitude is connected between the other input thereof and a reference potential.

11. A signal-shaping network comprising:

a differential amplifier having an output, an inverting and a non-inverting input;

means for providing a signal source coupled to said inverting and non-inverting inputs, said signal source not being referenced to a reference potential of said differential amplifier, a voltage differential of said signal source being applied across said inverting and non-inverting inputs;

an integrating feedback circuit connected between said output and one of said inputs to said differential amplifier; and a derivative feedback circuit connected between said output and the other of said inputs to said differential amplifier.

12. The signal-shaping network according to claim 11 wherein said integrating feedback circuit is connected to said non-inverting input of said differential amplifier with a phase shift of −180°.

13. The signal-shaping network according to claim 11 wherein said integrating feedback circuit is connected to said inverting input of the differential amplifier with a phase shift of 0°.

14. The signal-shaping network according to claim 11 wherein said derivative feedback circuit is connected to said inverting input of the differential amplifier with a phase shift of 0°.

* * * * *